United States Patent
Pannetier et al.

(10) Patent No.: US 7,511,483 B2
(45) Date of Patent: *Mar. 31, 2009

(54) DEVICE FOR SENSING RF FIELD

(75) Inventors: Myriam Pannetier, Bures sur Yvette (FR); Claude Fermon, Orsay (FR)

(73) Assignee: Commissariat Energie Atomique, Paris (FR)

( * ) Notice: Subject to any disclaimer, the term of this patent is extended or adjusted under 35 U.S.C. 154(b) by 328 days.

This patent is subject to a terminal disclaimer.

(21) Appl. No.: 10/543,981

(22) PCT Filed: Jan. 31, 2003

(86) PCT No.: PCT/EP03/01517

§ 371 (c)(1),
(2), (4) Date: Dec. 30, 2005

(87) PCT Pub. No.: WO2004/068152

PCT Pub. Date: Aug. 12, 2004

(65) Prior Publication Data

US 2006/0226827 A1    Oct. 12, 2006

(51) Int. Cl.
*G01R 33/09*   (2006.01)
*H01Q 7/00*    (2006.01)
*H01Q 7/06*    (2006.01)

(52) U.S. Cl. .................. 324/244; 324/252; 343/866

(58) Field of Classification Search ................. 324/244, 324/247, 248, 249, 251, 252, 258, 260; 343/787, 343/788, 866, 867
See application file for complete search history.

(56) References Cited

U.S. PATENT DOCUMENTS

| | | | | | |
|---|---|---|---|---|---|
| 3,551,706 | A | * | 12/1970 | Chapman | 327/511 |
| 3,812,428 | A | * | 5/1974 | Trenkler | 324/127 |
| RE31,613 | E | * | 6/1984 | Lienhard et al. | 324/117 R |
| 4,491,795 | A | * | 1/1985 | Gelinas | 324/248 |
| 4,849,696 | A | * | 7/1989 | Brun et al. | 324/252 |
| 4,875,011 | A | * | 10/1989 | Namiki et al. | 324/251 |
| 6,822,443 | B1 | * | 11/2004 | Dogaru | 324/235 |
| 2002/0089461 | A1 | * | 7/2002 | Mimura et al. | 343/742 |

FOREIGN PATENT DOCUMENTS

| | | | |
|---|---|---|---|
| DE | 196 50 078 | | 6/1998 |
| DE | 197 27 772 | | 1/1999 |
| GB | 2213267 | * | 8/1989 |
| JP | 2000-055997 | | 2/2000 |

* cited by examiner

*Primary Examiner*—Kenneth J Whittington
(74) *Attorney, Agent, or Firm*—Weingarten, Schurgin, Gagnebin & Lebovici LLP

(57) ABSTRACT

The device for sensing a RF field comprises a flux-receiving loop (1) including a circumferential path having a defined path width (d), the flux-receiving loop (1) having a portion (10) that transforms the magnetic flux flowing through the flux receiving loop (1) into a high magnetic field. The portion (10) comprises a constriction of the flux-receiving loop (1) that concentrates the current lines in the circumferential path to define a current-field transformer. At least one very low noise magnetic field transducer (12) is located at a very close distance from the constriction.

17 Claims, 2 Drawing Sheets

DEVICE FOR SENSING RF FIELD

This application is a §371 national phase filing of PCT/EP2003/001517 filed Jan. 21, 2003.

FIELD OF THE INVENTION

The invention relates to a device for sensing a radio frequency (RF) field.

DESCRIPTION OF THE PRIOR ART

Known methods for sensing a RF field usually imply the use of resonating circuits with the combination of a LC circuit, an amplifier and a voltage measurement. An example of such a kind of known sensing device using a voltage measurement is given in U.S. Pat. No. 6,373,253.

Other known devices for sensing a RF field involve Hall effect transducers which are fragile and have a limited sensitivity.

According to another known technique, a magnetic flux is converted into a current which itself retransmits a magnetic field which is detected by a very sensitive sensor of the SQUID type (i.e. involving a Superconducting Quantum Interference Device). However, the devices based on SQUIDs which have a high sensitivity are very intricate and cannot be used in conventional industrial environment or in portable devices.

SUMMARY OF THE INVENTION

The invention aims at remedying the above-mentioned drawbacks.

Accordingly, it is an object of the invention to provide a simple and efficient device for sensing a RF field in different environments including industrial environments.

It is another object of the invention to provide a robust and reliable sensing device which has a high sensitivity whilst being easy to manufacture and being substantially unaffected by external disturbances.

These aims are achieved due to a device for sensing a RF field, wherein it comprises a flux-receiving loop including a circumferential path having a defined path width, said flux-receiving loop having a portion that transforms the magnetic flux flowing through the flux-receiving loop into a high magnetic field, wherein said portion comprises a constriction of the flux-receiving loop that concentrates the current lines in the circumferential path to define a current-field transformer, and at least one very low noise magnetic field transducer which is located at a very close distance from said constriction.

Preferably, said very low noise magnetic field transducer comprises a giant magnetoresistor (GMR).

Alternatively, said very low noise magnetic field transducer may comprise a tunneling magneto resistance (TMR) or a colossal magneto resistance (CMR).

The device according to the invention may be applied to radiofrequency signals in the 10 kHz to 30 GHz range.

The device according to the invention may then be more specifically applied to radiofrequency identification (RF-ID). In such application, the working frequencies may be for example 125 kHz, 13.56 MHz and 2.45 GHz but other frequencies may also be used up to 30 GHz.

The device according to the invention may be further applied to Nuclear Quadrupolar Resonance (NQR), in particular for the explosive detection, with working frequencies preferably comprised between 50 kHz and 10 MHz.

The device according to the invention may be used as a very sensitive receiver for RF wireless transmissions.

Other applications of the sensor according to the present invention may include among others measurement of the field induced by radio antennae.

According to a specific embodiment of the invention, the constriction is long enough to accommodate a plurality of juxtaposed very low noise magnetic field transducers.

In such a case, according to a more specific embodiment, each individual very low noise magnetic field transducer is connected to a separate reading amplifier and the outputs of said separate reading amplifiers are connected to a single adding amplifier.

Alternatively, the signals provided by the plurality of very low noise magnetic field transducers can be cross-correlated.

According to an embodiment of the invention, the flux-receiving loop is manufactured by lithography in thin film and the at least one very low noise magnetic field transducer comprises at least one magnetoresistive sensor in thin film which is superimposed to said constriction, an insulating layer of small thickness being interposed between the at least one magnetoresistive sensor and the constriction.

In such a case, the flux-receiving loop may have a wider dimension (D) comprised between one millimeter and a few centimeters.

Preferably the constriction has a width (W) comprised between a few tens of nanometers and a few micrometers.

The insulated layer has a thickness lower than 100 nanometers.

Advantageously, the constriction has a length comprised between several micrometers to several tens of micrometers.

According to another embodiment of the invention, the constriction of the flux receiving loop is longer and wounded in a coil, whose self induction is of the same order of magnitude than the self induction of the flux-receiving loop (ideally equal), the core of this coil being a magnetoresistive bar constituting the very low noise magnetic field transducer.

A capacitor can be associated with the flux-receiving loop in order to form a selective resonant receiver.

With such an embodiment, the diameter (D) of the flux-receiving loop may be comprised between several micrometers and several decimeters, according to the application which is contemplated.

BRIEF DESCRIPTION OF THE DRAWINGS

These and other objects and features of the present invention will become clearer from the following description of specific embodiments given by way of examples with reference to the accompanying drawings, in which.

DETAILED DESCRIPTION OF THE INVENTION

Basically, according to the invention, in a RLC-type resonating circuit or LR circuit, the current generated by the induced RF field is measured using magneto resistive elements which are located very close to the flux-field transformer.

Thus, among devices including a flux-receiving loop devoted to the measure of the flux through conversion in a current, the present invention provides a portion that transforms the magnetic flux flowing through the flux-receiving loop into a high magnetic field.

Figure 1:
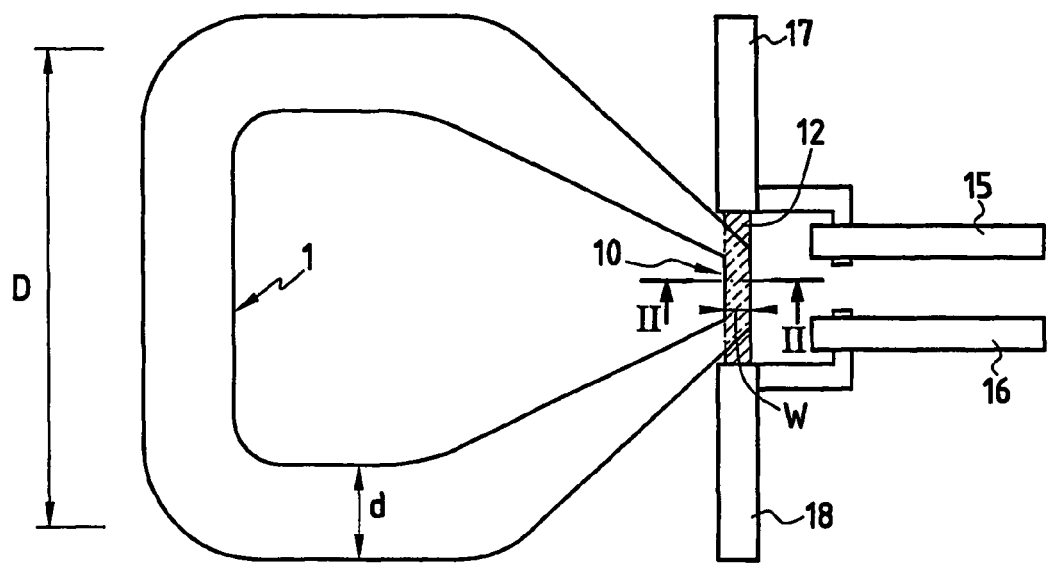
FIG. 1 is a schematic view of a RF sensing device according to an embodiment of the invention which is integrated by lithography in thin film.
Figure 3:
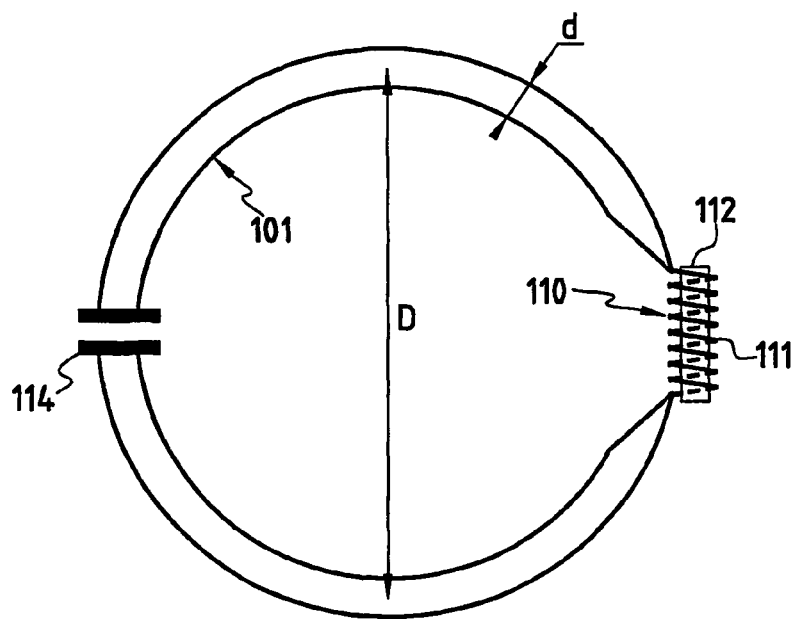
FIG. 3 is a schematic view of a RF sensing device according to another embodiment of the invention and comprising a secondary coil.
Figure 4:
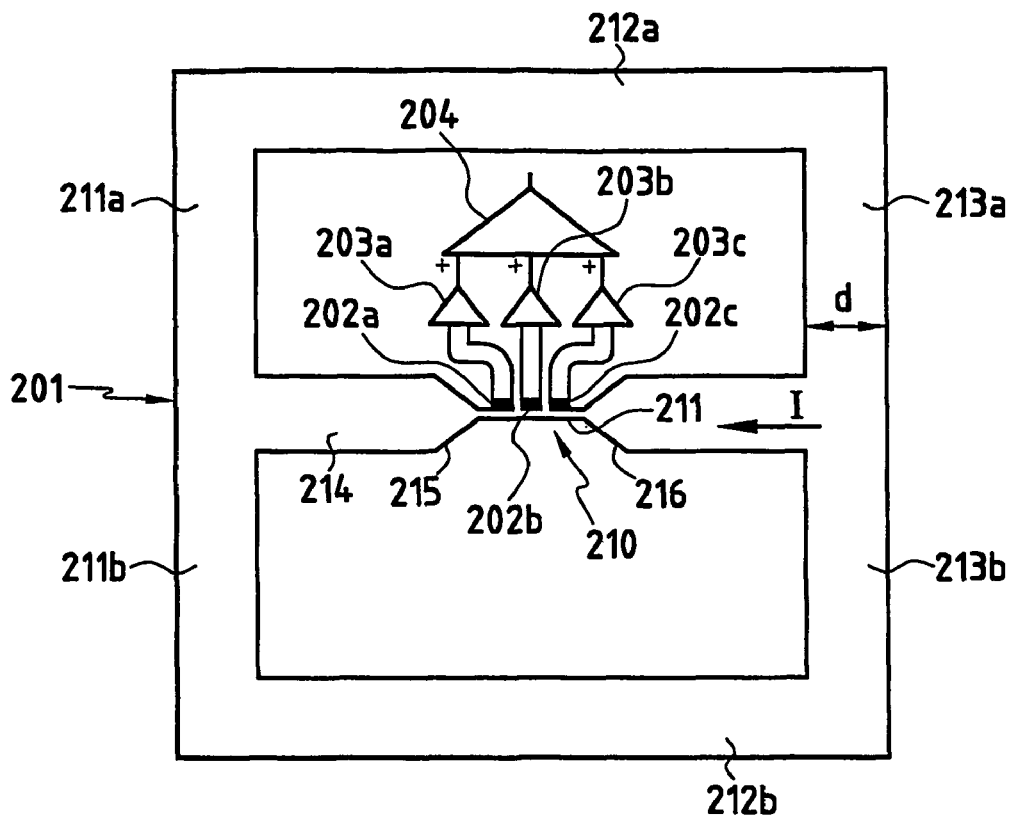
FIG. 4 is a schematic view of still another embodiment of a RF sensing device according to the invention comprising a plurality of magnetoresistive elements, the pick up coil having been designed as a gradiometer.

FIGS. 1, 3 and 4 relate to different embodiments of a sensing device according to the invention.

A flux receiving loop 1 (FIG. 1), 101 (FIG. 3) or 201 (FIG. 4) includes a circumferential path having a defined path width d. The circumferential path may be substantially square-shaped (FIG. 1), circular (FIG. 3) or eight-shaped (FIG. 4). Other known configurations for a flux-receiving loop may further be contemplated. For the sake of clarity, the coils associated with the circumferential paths of the flux receiving loops 1, 101, 201 are not shown on the drawings.

Each flux-receiving loop 1, 101, 201 comprises a portion 10, 110, 210 which defines a constriction of the flux receiving loop 1, 101, 201 respectively. The constricted portion 10, 110, 210 concentrates the current lines in the circumferential path to define a current field transformer.

The so-produced field in the constricted portion 10, 110, 210 is measured at a very close distance with at least one very low noise magnetic field transducer 12; 112; 202a, 202b, 202c of the magnetoresistive type.

A giant magneto resistor (GMR) is used but other even more sensitive magnetoresistive elements such as Tunneling Magneto-Resistors or Colossal Magneto-Resistors can be used as well since the same physical phenomenon is involved.

Figure 2:
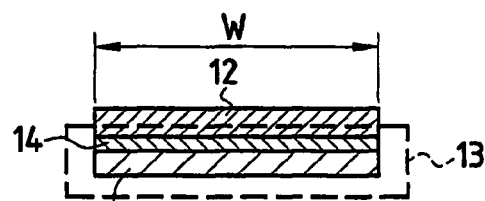
FIG. 2 is a cross-sectional view along line II-II of FIG. 1.

FIGS. 1 and 2 relate to a first embodiment of the present invention which implies an integration by lithography in thin film that allows an optimisation of the design.

The complete flux-receiving loop 1 may be manufactured by lithography in thin film, including the constricted portion, as well as the at least one noise magnetic field transducer comprising at least one magnetoresistive sensor 12 in thin film which is superimposed to the constriction 11, an insulating layer 14 of small thickness being interposed between the magnetoresistive sensor 12 and the constriction 11, the magnetic field being identified by reference 13 (FIG. 2).

Alternatively, a mixed concept may also be realized. In such a case, the constricted portion 10 and the sensor 12 are lithographically patterned as shown on FIGS. 1 and 2, whereas the constricted portion 10 is linked to a flux-receiving loop 1 of biggest size which is manufactured by other conventional techniques. In this way there is no actual limitation in the size of the flux-receiving loop 1 which may have a quite large mean dimension D (FIG. 1).

In the embodiment of FIG. 1 where at least the constricted portion 10 and the magnetoresistive sensor 12 are lithographically patterned, the impedance of the flux-receiving loop 1 and of the constricted portion 10 constituting a field generating loop should be matched.

The close coupling of the magnetoresistive sensor 12 enhances the sensitivity.

If the complete flux-receiving loop 1 is lithographically patterned, the dimension D of the loop 1 may be comprised between about 0.1 millimeter and a few centimeters.

The field sensor 12 is located on the constriction 11 of the loop 1.

The width W of the constriction 11 may be comprised between a few hundreds of nanometers and several micrometers. The length of the constriction 11 may be chosen between several micrometers and several tens of micrometers.

The constriction 11 is located above or under the magnetoresistive sensor 12 and is separated by an electrically insulating layer 14 having a thickness lower than 100 nm. The flux received by the loop 1 induces a circulating current with a maximum value in the constriction 11, the field lines 13 of which are detected by the magnetoresistive sensor 12. The detection is achieved by measuring the change in the resistance of the sensor 12. This measurement is achieved through a current injection between terminals 15 and 16 and a voltage measurement between terminals 17 and 18 (see the top view of FIG. 1).

At high frequencies using a resonating circuit according to the invention with a transducer such as a GMR 12 is equivalent to make the measurement with an ideal preamplifier.

At very high frequencies, larger than 100 MHz, it is possible to use the spin waves resonances of the sensors in order to increase the signal to noise ratio of the sensor.

The device may be improved with the use of a plurality of juxtaposed transducers 202a, 202b, 202c (FIG. 4) to partially suppress the noise. For instance the association of N transducers allows an increase of the sensitivity by a factor $\sqrt{N}$. In such a case, the constriction 211 should be long enough to allow the location of several magnetoresistive elements very close to it. If the constriction length becomes too long (resistance too high), the transducers can be placed on both sides of the constriction (e.g. above and under the constriction).

In the embodiment of FIG. 4, the averaging of the detected signals may be performed either by connecting each element 202a, 202b, 202c to a separate reading amplifier 203a, 203b, 203c and summing in an adder amplifier 204 all the signals outputted by the amplifiers 203a, 203b, 203c either by correlation.

In the embodiment of FIG. 4, the flux-receiving loop 201 has a eight shape and comprises two loops having a common branch 214 comprising the portion 210 with the constriction 211. The common branch 214 may have V-shaped portions 215, 216 contiguous to the constriction 211. This design is devoted to gradiometer applications and it can be used for example for mine detection, with total dimension of about 20 cm for anti-personal mine.

According to another embodiment shown on FIG. 3, a flux-receiving loop 101 comprises a circumferential path of a defined width d and has a mean dimension or diameter D which may be of various sizes, from a micrometer to decimeters, depending on the targeted applications. The flux-receiving loop 101 comprises a coil (not shown) having one or several turns depending on the working frequency. The induced current in the loop 101 goes through a coil 111 located at the level of a constricted portion 110 of the loop 101. The number of turns of the coil 111 is a function of the impedance matching the main loop 101. The coil 111 is wound around a magnetoresistive bar 112. The coil 111 may be made of a wire having a smaller diameter than the main coil to allow a higher number of turns. A capacitor 114 is associated with the flux-receiving loop 101 according to the resonating conditions of the circuit.

The changes in the resistance of the sensor 112 may be measured in the same way as in the case of the embodiment of FIG. 1, a current being injected through two terminals and a voltage measurement being made via two other terminals. Those terminals similar to terminals 15, 16 and 17, 18 of FIG. 1 are not shown on FIG. 3.

The optimization of the device must be done according to the frequency and the surface of detection. One must first define the surface of detection. The number of turns of the coil of the flux-receiving loop may be equal to one or to a higher integer, but is limited by the characteristic frequency of this loop. One must also take into account the according capacitors 114 available. The resistance must be as low as possible.

The constriction must be minimized with respect to the lithographic techniques which are implemented. However, the narrower the constriction the greater the amplification.

In the case of a resonant circuit, the additional resistance of the constriction has to be taken into account. Using a 10 micrometers long and a 1 micrometer wide constriction or wounded coil adds a 1 Ohm resistance in the circuit. The resonant factor Q of the circuit is given by $Q=L\omega/R$ and can be degraded if L (equal to the sum of the inductance of the pick-up loop and the self inductance of the constriction) is rather small. R is the total resistance of the circuit and $\omega$ the pulsation ($2\pi$ times the working frequency). At high frequencies, this is not a limitation of the design.

For an integrated or manual coil such as 111, one must define the maximum number of turns around the GMR 112 to maximize the filing factor (being the closest) and adjust the number of turns to match the large loop impedance. Empirically one can say that the ratio of the number of turns is inversely proportional to the radius. One must then calculate the resistance of the constriction or of the coil, knowing that this resistance will determine the Q-factor of the whole and must be minimum. This resistance will be proportional to the number of turns of the small coil such as 111.

Together these constraints will be easier to achieve with a greater working frequency.

As a practical example, a pick-up coil is made of 3 turns having a 15 cm diameter, the wounded coil is 0.1×1 mm diameter with 50 turns around a GMR sensor for personal mine detection.

Another fabrication method may be from the magnetoresistive element to add one or several turns by lithography (single or multilayer). This method is suitable for very small size devices, typically micrometer-size. The lower limitation in size is given by the increase of the conductive resistance. Nevertheless, according to the standard techniques, and especially the difficulty of realizing several loop levels by lithography, the number of turns obtained that way will be limited compared to the manual winding process but distances are well mastered.

Figure 5:
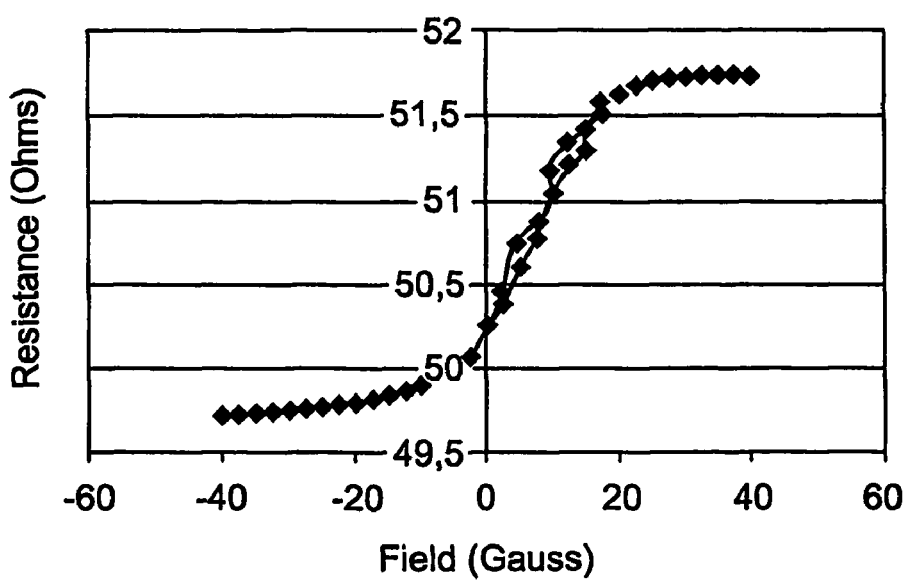
FIG. 5 is a diagram showing the characteristics of a GMR which may be used with a RF sensing device according to the invention.

FIG. 5 shows an example of characteristics of a particular GMR which can be used in a device according to the invention. Thus the curve illustrated on FIG. 5 gives the resistance of a GMR in Ohms as a function of the field in Gauss.

The invention claimed is:

1. A device for sensing an RF field, the device comprising a flux-receiving loop including a circumferential path having a defined path width (d), said flux-receiving loop having a portion that transforms a magnetic flux flowing through the flux receiving loop into a high magnetic field, wherein said portion comprises a constriction of the flux-receiving loop that concentrates current lines in the circumferential path to define a current-field transformer, and at least one very low noise magnetic field transducer which is located at a very close distance from said constriction, wherein the flux-receiving loop is manufactured by lithography in thin film and the at least one very low noise magnetic field transducer comprises at least one magnetoresistive sensor in thin film which is superimposed to said constriction, an insulating layer of small thickness being interposed between the at least one magnetoresistive sensor and the constriction.

2. A device according to claim 1, wherein said at least one very low noise magnetic field transducer comprises a giant magneto resistance (GMR).

3. A device according to claim 1, wherein said at least one very low noise magnetic field transducer comprises a tunneling magneto resistance or a colossal magneto resistance.

4. A device according to claim 1, wherein the device is applied to radiofrequency signals in the 10 kHz-30 GHz range.

5. A device according to claim 1, wherein the constriction is long enough to accommodate a plurality of juxtaposed very low noise magnetic field transducers.

6. A device according to claim 5, wherein each at least one very low noise magnetic field transducer is connected to a separate reading amplifier and outputs of said separate reading amplifiers are connected to a single adding amplifier.

7. A device according to claim 1, wherein the constriction has a length comprised between several micrometers to several tens of micrometers.

8. A device according to claim 1, wherein the flux receiving loop has a wider dimension (D) comprised between 1 millimeter and a few centimeters.

9. A device according to claim 1, wherein the constriction has a width (W) comprised between a few hundreds of nanometers and a few micrometers.

10. A device according to claim 1, wherein the insulated layer has a thickness lower than 100 nanometers.

11. A device for sensing an RF field, the device comprising a flux-receiving loop including a circumferential path having a defined path width (d), said flux-receiving loop having a portion that transforms a magnetic flux flowing through the flux receiving loop into a high magnetic field, wherein said portion comprises a constriction of the flux-receiving loop that concentrates current lines in the circumferential path to define a current-field transformer, and at least one very low noise magnetic field transducer which is located at a very close distance from said constriction,
wherein the device is applied to radiofrequency signals in the 10 kHz-30 GHz range, and
wherein:
the constriction of the flux-receiving loop is wound in a coil whose self induction is of the same order of magnitude as the self induction of the rest of the flux-receiving loop and a magnetoresistive bar is located as the core of said coil to constitute said at least one very low noise magnetic field transducer;
a capacitor is associated with the flux-receiving loop; and
a diameter (D) of the flux-receiving loop is comprised between several micrometers and several decimeters.

12. A device for sensing an RF field, the device comprising a flux-receiving loop including a circumferential path having a defined path width (d), said flux-receiving loop having a portion that transforms a magnetic flux flowing through the flux receiving loop into a high magnetic field, wherein said portion comprises a constriction of the flux-receiving loop that concentrates current lines in the circumferential path to define a current-field transformer, and at least one very low noise magnetic field transducer which is located at a very close distance from said constriction, wherein the constriction of the flux-receiving loop is wound in a coil whose self induction is of the same order of magnitude as the self induction of the rest of the flux-receiving loop and a magnetoresistive bar is located as the core of said coil to constitute said at least one very low noise magnetic field transducer.

13. A device according to claim 12, wherein a capacitor is associated with the flux-receiving loop.

14. A device according to claim 12, wherein a diameter (D) of the flux-receiving loop is comprised between several micrometers and several decimeters.

15. A device according to claim 12, wherein:
   a capacitor is associated with the flux-receiving loop; and
   a diameter (D) of the flux-receiving loop is comprised between several micrometers and several decimeters.

16. A device for sensing an RF field, the device comprising a flux-receiving loop including a circumferential path having a defined path width (d), said flux-receiving loop having a portion that transforms a magnetic flux flowing through the flux receiving loop into a high magnetic field, wherein said portion comprises a constriction of the flux-receiving loop that concentrates current lines in the circumferential path to define a current-field transformer, and at least one very low noise magnetic field transducer which is located at a very close distance from said constriction,
   wherein said at least one very low noise magnetic field transducer comprises a giant magneto resistance (GMR), and
   wherein:
   the device is used with radiofrequency signals in the 10 kHz-30 GHz range;
   the constriction is long enough to accommodate a plurality of juxtaposed very low noise magnetic field transducers;
   each at least one very low noise magnetic field transducer is connected to a separate reading amplifier and outputs of said separate reading amplifiers are connected to a single adding amplifier;
   the flux-receiving loop is manufactured by lithography in thin film and the at least one very low noise magnetic field transducer comprises at least one magnetoresistive sensor in thin film which is superimposed to said constriction, an insulating layer of small thickness being interposed between the at least one magnetoresistive sensor and the constriction;
   the flux receiving loop has a wider dimension (D) comprised between 1 millimeter and a few centimeters;
   the constriction has a width (W) comprised between a few hundreds of nanometers and a few micrometers;
   the insulated layer has a thickness lower than 100 nanometers; and
   the constriction has a length comprised between several micrometers to several tens of micrometers.

17. A device for sensing an RF field, the device comprising a flux-receiving loop including a circumferential path having a defined path width (d), said flux-receiving loop having a portion that transforms a magnetic flux flowing through the flux receiving loop into a high magnetic field, wherein said portion comprises a constriction of the flux-receiving loop that concentrates current lines in the circumferential path to define a current-field transformer, and at least one very low noise magnetic field transducer which is located at a very close distance from said constriction,
   wherein said at least one very low noise magnetic field transducer comprises a tunneling magneto resistance or a colossal magneto resistance, and
   wherein:
   the device is used with radiofrequency signals in the 10 kHz-30 GHz range;
   the constriction is long enough to accommodate a plurality of juxtaposed very low noise magnetic field transducers;
   each at least one very low noise magnetic field transducer is connected to a separate reading amplifier and outputs of said separate reading amplifiers are connected to a single adding amplifier;
   the flux-receiving loop is manufactured by lithography in thin film and the at least one very low noise magnetic field transducer comprises at least one magnetoresistive sensor in thin film which is superimposed to said constriction, an insulating layer of small thickness being interposed between the at least one magnetoresistive sensor and the constriction;
   the flux receiving loop has a wider dimension (D) comprised between 1 millimeter and a few centimeters;
   the constriction has a width (W) comprised between a few hundreds of nanometers and a few micrometers;
   the insulated layer has a thickness lower than 100 nanometers; and
   the constriction has a length comprised between several micrometers to several tens of micrometers.

* * * * *

UNITED STATES PATENT AND TRADEMARK OFFICE
CERTIFICATE OF CORRECTION

PATENT NO. : 7,511,483 B2  
APPLICATION NO. : 10/543981  
DATED : March 31, 2009  
INVENTOR(S) : Myriam Pannetier et al.

Page 1 of 1

It is certified that error appears in the above-identified patent and that said Letters Patent is hereby corrected as shown below:

Column 3, line 17, "d" should read --d--;

Column 3, lines 30-31, "202a, 202b, 202c" should read --202a, 202b, 202c--;

Column 4, line 23, "202a, 202b, 202c" should read --202a, 202b, 202c--;

Column 4, line 33, "202a, 202b, 202c" should read --202a, 202b, 202c--;

Column 4, lines 33-34, "203a, 203b, 203c" should read --203a, 203b, 203c--;

Column 4, line 35, "203a, 203b, 203c" should read --203a, 203b, 203c--;

Column 4, line 47, "d" should read --d--; and

Column 5, line 23, "filing" should read --filling--.

Signed and Sealed this

Twelfth Day of January, 2010

David J. Kappos
*Director of the United States Patent and Trademark Office*